United States Patent
Yoshizaki et al.

(10) Patent No.: US 9,212,722 B2
(45) Date of Patent: Dec. 15, 2015

(54) VIBRATION REDUCTION APPARATUS AND METHOD

(75) Inventors: Yuji Yoshizaki, Tokyo (JP); Hiroshi Ito, Tokyo (JP); Hidetoshi Suzuki, Tokyo (JP)

(73) Assignee: MITSUBISHI HEAVY INDUSTRIES, LTD., Tokyo (JP)

(*) Notice: Subject to any disclaimer, the term of this patent is extended or adjusted under 35 U.S.C. 154(b) by 372 days.

(21) Appl. No.: 13/581,192

(22) PCT Filed: Feb. 22, 2011

(86) PCT No.: PCT/JP2011/053767
§ 371 (c)(1),
(2), (4) Date: Sep. 24, 2012

(87) PCT Pub. No.: WO2011/105345
PCT Pub. Date: Sep. 1, 2011

(65) Prior Publication Data
US 2013/0033202 A1 Feb. 7, 2013

(30) Foreign Application Priority Data
Feb. 26, 2010 (JP) ................... 2010-041767

(51) Int. Cl.
*H02K 33/00* (2006.01)
*H02P 1/00* (2006.01)
(Continued)

(52) U.S. Cl.
CPC .............. *F16F 15/02* (2013.01); *B64C 27/001* (2013.01); *F16F 15/005* (2013.01); *H01L 41/042* (2013.01); *H01L 41/09* (2013.01); *B64C 2027/004* (2013.01)

(58) Field of Classification Search
CPC ................... B64C 27/001; B64C 2027/004
USPC .......................................... 318/114
See application file for complete search history.

(56) References Cited

U.S. PATENT DOCUMENTS 6,067,859 A * 5/2000 Kas et al. .................. 73/800
6,224,014 B1 * 5/2001 Dussac ................... 244/17.27
(Continued)

FOREIGN PATENT DOCUMENTS

JP 8-326835 12/1996
JP 2004-511732 4/2004
(Continued)

OTHER PUBLICATIONS

Japanese Office Action issued May 27, 2011 in corresponding Japanese Patent Application No. 2010-041767 with English translation.
(Continued)

*Primary Examiner* — Erick Glass
(74) *Attorney, Agent, or Firm* — Wenderoth, Lind & Ponack, L.L.P.

(57) ABSTRACT

A vibration reduction apparatus includes an actuator applying a force to a beam supporting a cabin so as to bend the beam, an acceleration sensor measuring the acceleration of the cabin, and a controller controlling the actuator based on the measured acceleration. When a vibration containing a plurality of vibration components is transmitted to the cabin via the beam, the vibration reduction apparatus thus structured reduces the vibration more certainly by applying a bending load to the beam so that the bending load caused by the vibration is cancelled. This provides damping of the cabin more certainly.

6 Claims, 6 Drawing Sheets

(51) Int. Cl.
  *H02P 3/00* (2006.01)
  *H02P 5/00* (2006.01)
  *F16F 15/02* (2006.01)
  *B64C 27/00* (2006.01)
  *F16F 15/00* (2006.01)
  *H01L 41/04* (2006.01)
  *H01L 41/09* (2006.01)

(56) References Cited

U.S. PATENT DOCUMENTS

| | | | |
|---|---|---|---|
| 6,467,723 B1 * | 10/2002 | Rossetti et al. | 244/17.11 |
| 2004/0070311 A1 | 4/2004 | Bebesel et al. | |
| 2009/0321556 A1 | 12/2009 | Pancotti et al. | |
| 2010/0000350 A1 * | 1/2010 | Carlson | 74/5.22 |
| 2010/0034655 A1 * | 2/2010 | Jolly et al. | 416/145 |

FOREIGN PATENT DOCUMENTS

| | | |
|---|---|---|
| JP | 2007-015681 | 1/2007 |
| JP | 2008-190617 | 8/2008 |
| JP | 2008-232331 | 10/2008 |
| JP | 2008-291954 | 12/2008 |

OTHER PUBLICATIONS

International Search Report issued Jun. 7, 2011 in International (PCT) Application No. PCT/JP2011/053767.
International Preliminary Report on Patentability and Written Opinion of the International Searching Authority issued Sep. 18, 2012 in International (PCT) Application No. PCT/JP2011/053767.

* cited by examiner

VIBRATION REDUCTION APPARATUS AND METHOD

TECHNICAL FIELD

The present invention relates to a vibration reduction apparatus and method, more particularly, to a vibration reduction apparatus and method which are used in reducing vibration.

BACKGROUND ART

Helicopters which have rotor blades above the airframe can vertically ascend and descend, fly forwards and backwards and hover as is known. In such a helicopter, an N/rev vibration is generated by the rotor blades when the number of the rotor blades is N (N being an integer) and vibrations other than the N/rev vibration are further generated due to effects of the wind received by the helicopter and so on. It is desired that the interior comfort of the helicopter is improved; therefore the vibration transmitted to crews is desirably reduced.

Japanese Translation of PCT application No. 2004-511732 discloses a piezoelectric expansion actuator which can suppress vibration in a structure and reduce the structure volume of the piezoelectric actuator while achieving a remarkable improvement in the efficiency of the force introduction of the piezoelectric actuator, which tends to conflict the structure volume reduction. The disclosed distortion actuator is a piezoelectric distortion actuator for reducing vibration in a structure, characterized in that the distortion actuator includes a piezoelectric stack constituted by d33 piezoelectric elements disposed between output elements fixed to the surface of the structure.

CITATION LIST

Patent Literature

Patent Literature 1:
Japanese Translation of PCT application No. 2004-511732

DISCLOSURE OF INVENTION

An object of the present invention is to provide a vibration reduction apparatus and method which achieve vibration reduction of a targeted object more certainly.

A vibration reduction apparatus according to the present invention includes: an actuator apply a force to a vibration transmitting member fixed to a targeted object so as to bend the vibration transmitting member; an acceleration sensor measuring the acceleration of the targeted object; and a controller controlling the actuator based on the measured acceleration. When a vibration containing a plurality of vibration components is transmitted to the targeted object via the vibration transmitting member, the vibration reduction apparatus thus structured can achieve the vibration reduction more certainly by applying a bending load to the vibration transmitting member so that the bending load caused by the vibration is cancelled; this allows providing the vibration reduction of the targeted object more certainly.

The actuator preferably bends the vibration transmitting member so that the vibration transmitting member is subjected to in-plane bending in a plane in which the vibration transmitting member is hard to be bent in-plane.

The vibration transmitting member includes: a web portion formed in a strip shape; a first flange portion formed on one edge of the web portion; and a second flange portion formed on another edge opposite to the one edge of the web portion.

It is preferable that the actuator bends the vibration transmitting member so that the vibration transmitting member is bent in-plane along a plane along which the web portion is disposed.

The actuator includes: a first actuator which expands and contracts the first flange portion; and a second actuator which expands and contracts the second flange portion.

The actuator includes: a piezoelectric element having both ends fixed to the vibration transmitting member; and a piezo driver applying a voltage to the piezoelectric element. The controller controls the piezo driver so that the vibration transmitting member is bent.

The vibration reduction apparatus according to the present invention further includes a rotational speed sensor measuring the number of rotations per unit time of a rotating body. It is preferable that the controller controls the actuator further based on the number of rotations per unit time.

A helicopter according to the present invention includes: the vibration reduction apparatus according to the present invention, and rotor blades generating thrust force of the helicopter by rotations thereof. The rotor blades are rotatably supported by the vibration transmitting member.

A vibration reduction method according to the present invention includes: a step of measuring an acceleration of a targeted object; and a step of controlling an actuator which applies a force to a vibration transmitting member fixed to the targeted object based on the acceleration so that the vibration transmitting member is bent. According to the above-described vibration reduction method, when a vibration containing a plurality of vibration components is transmitted to the targeted object via the vibration transmitting member, the controller controlling the actuator can achieve the vibration reduction more certainly by applying a bending load to the vibration transmitting member so that the bending load caused by the vibration is cancelled; this allows providing the vibration reduction of the targeted object more certainly.

The actuator preferably includes: a first actuator which expands and contracts the first flange portion; and a second actuator which expands and contracts the second flange portion.

The actuator includes: a piezoelectric element having both ends fixed to the vibration transmitting member; and a piezo driver applying a voltage to the piezoelectric element. The controller controls the piezo driver so that the vibration transmitting member is bent.

The vibration reduction method further includes a step of measuring the number of rotations per unit time of a rotating body rotatably supported by the vibration transmitting member. It is preferable that the actuator is controlled further based on the measured number of rotations per unit time.

It is preferable that a computer program according to the present invention causes a computer to perform the vibration reduction method according to the present invention.

The vibration reduction apparatus and method, even when a vibration containing a plurality of vibration components is transmitted to the targeted object via the vibration transmitting member, can reduce the vibration transmitted via the vibration transiting member more certainly by appropriately bending the vibration transmitting member; this allows providing the vibration reduction of the targeted object more certainly.

EMBODIMENTS OF INVENTION

Figure 1:
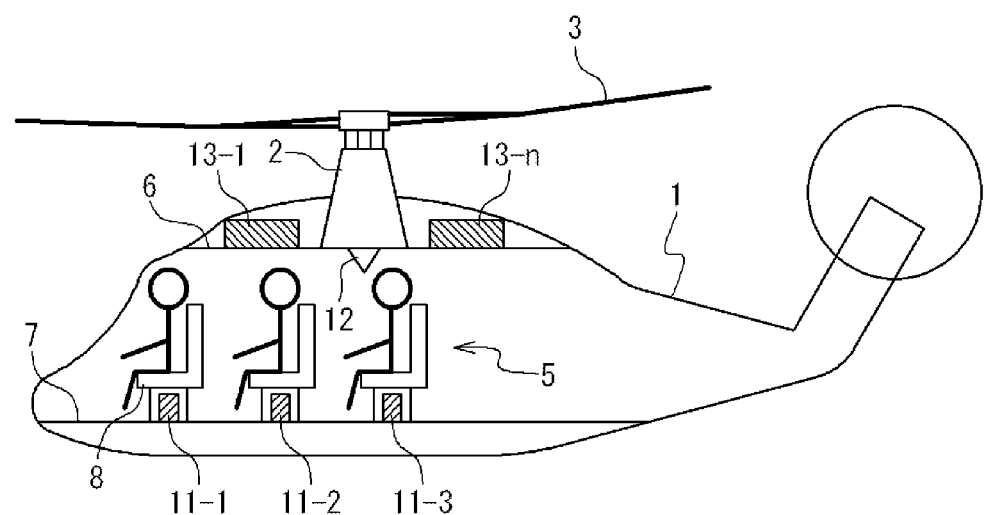
FIG. 1 is a diagram showing a helicopter according to the present invention.

Embodiments of a helicopter according to the present invention will be described below with reference to the drawings. The helicopter, as shown in FIG. 1, includes a vibration reduction apparatus in a helicopter body. The helicopter body includes a main structure 1, a transmission 2, main rotor blades 3 and a cabin 5. The main structure 1 forms a helicopter frame. The transmission 2 supports the main rotor blades 3 rotatably to the main structure 1. Furthermore, the transmission 2 transmits rotational energy from a rotational energy source (not shown) to the main rotor blades 3 so as to rotate the main rotor blades 3 with respect to the main structure 1 at a predetermined rotational velocity. The main rotor blades 3 have an airfoil shape. The airfoils generate lift force when the main rotor blades 3 are rotated with respect to the main structure 1. In other words, the main rotor blades 3 generate the thrust force of the helicopter by rotating with respect to the main structure 3.

The cabin 5 is formed in a box shape and includes a cabin ceiling 6, an under-floor structure 7 and a plurality of seats 8. The cabin ceiling 6 is disposed in an upper part of the cabin 5 and supported by the main structure 1. The under-floor structure 7 is disposed in a lower part of the cabin 5 and supported by the main structure 1. The seats 8 are disposed in the cabin 5 and fixed to the under-floor structure 7. The seats 8 are used for crews of the helicopter to sit thereon.

In such structure, the vibration generated by the rotation of the main rotor blade 3 is transmitted to the main structure 1 via the transmission 2, then transmitted from the main structure 1 to the cabin 5 and then transmitted to the crews from the seats 8 in the cabin 5.

The vibration reduction apparatus includes a plurality of airframe acceleration sensor sensors 11-1 to 11-3, a main rotor rotational speed sensor 12 and a plurality of elastically-beam-bending vibration absorbing elements 13-1 to 13-$n$ ($n=2, 3, 4 \ldots$). The airframe acceleration sensors 11-1 to 11-3 are fixed at respective positions of the under-floor structure 7 where the plurality of seats 8 are fixed, respectively. The airframe acceleration sensor 11-$j$ ($j=1, 2$ or $3$) of the airframe acceleration sensors 11-1 to 11-3 measures the acceleration of the portion of the under-floor structure 7 to which the airframe acceleration sensor 11-$j$ is fixed.

The main rotor rotational speed sensor 12 measures the number of rotations per unit time of the main rotor blades 3 with respect to the main structure 1.

The plurality of vibration absorbing elements 13-1 and 13-2 are each fixed to a portion of the main structure 1, respectively.

Figure 2:
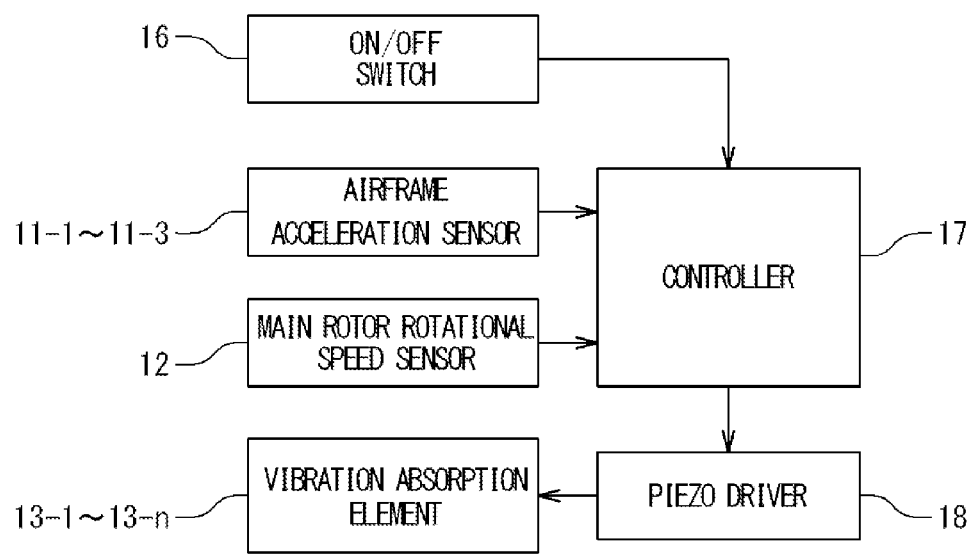
FIG. 2 is a block diagram showing a vibration reduction apparatus according to the present invention.

FIG. 2 shows the vibration reduction apparatus. The vibration reduction apparatus further includes an input device 16, a controller 17 and a piezo driver 18. The input device 16, which is disposed in a cockpit formed in the cabin 5, generates data in response to a user's operations and outputs the generated data to the controller 17. For example, the input device 16 selects one of a control-on mode and a control-off mode in response to the user's operation, and outputs the selected mode to the controller 17. The piezo drive 18, which is disposed in the helicopter, outputs predetermined electric signals to the vibration absorbing elements 13-1 and 13-2 under the control of the controller 17.

The controller 17 is disposed in the helicopter. The controller 17, which is a computer, includes a CPU (not shown), a storage device, a removable memory drive and an interface. The CPU executes a computer program installed on the controller 17 to control the storage device and the interface. The storage device stores the computer program and temporarily stores data generated by the CPU. The removable memory drive is used to read out data recorded on a recording medium when the recording medium is inserted thereinto. The removable memory drive is further used to install the computer program onto the controller 17, when a recording medium recording the computer program is inserted thereinto. Examples of the recording medium include a flash memory, a magnetic disc (a flexible disc and a hard disc), an optical disc (CD and DVD) and a magnetic optical disc. The interface outputs data generated by external devices connected to the controller 17 to the CPU and outputs data generated by the CPU to the external devices. The external devices include the plurality of the airframe acceleration sensors 11-1 to 11-3, the main rotor rotational speed sensor 12, the input device 16 and the piezo driver 18.

Figure 3:
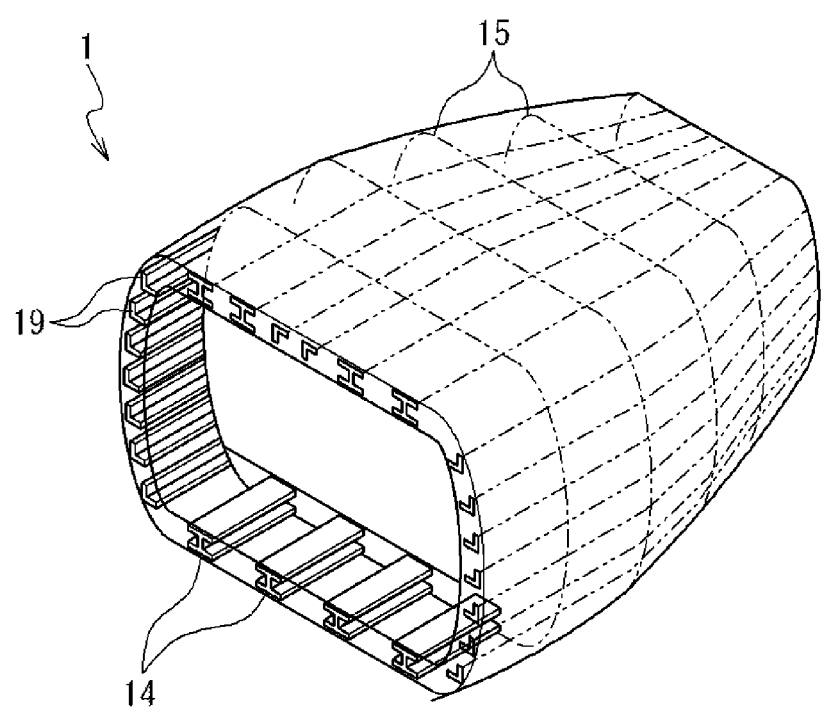
FIG. 3 is a perspective view partially showing a main structure.

FIG. 3 partially shows the main structure 1. The main structure 1 includes a plurality of beams 14, a plurality of frames 15 and a plurality of stringers 19. The beams 14 are each formed of steel and fixed to one another. The transmission 2 is fixed to two or more beams 14. The cabin ceiling 6 and the under-floor structure 7 of the cabin 5 are fixed to any of the plurality of beams 14. The frames 15 are each formed of steel and fixed to any of the beams 14. The stringers 19 are each formed of steel and fixed to any of the beams 14 or the frames 15. The outer casing of the helicopter according to the present invention is fixed to the stringers 19. The beams 14, the frames 15 and the stringers 19 may be formed of material other than steel. Examples of such material include aluminum, titanium and composite materials.

Figure 4:
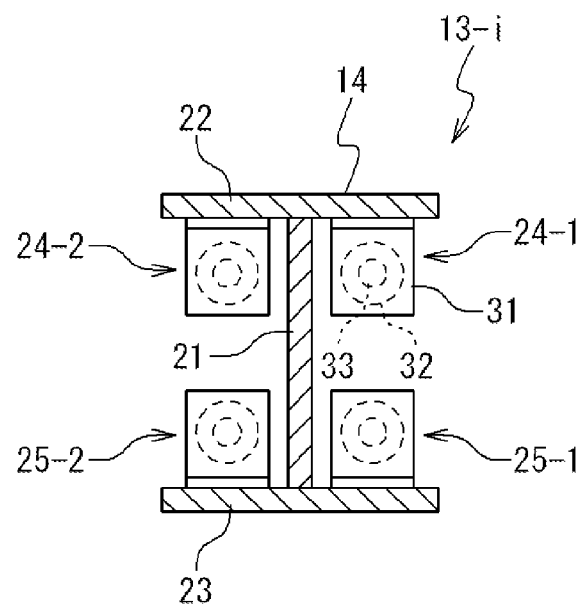
FIG. 4 is a cross section view showing a beam.

FIG. 4 shows a beam 14. The beam 14 is formed of so-called I-section steel; the beam 14 includes a web portion 21 and first and second flange portions 22 and 23. The web portion 21 is formed in a strip shape. The first flange portion 22 is formed in a strip shape. The second flange portion 23 is formed in a strip shape in the same way as the first flange portion 22. The beam 14 is formed so that the first flange portion 22 is coupled to one edge of the web portion 21 and the second flange portion 23 is coupled to the opposite edge of the web portion 21. Furthermore, the beam 14 is formed so that the first and second flanges 22 and 23 are opposed across the web portion 21.

The beam 14 thus constructed is hard to be bent in-plane in a plane along which the web portion 21 is disposed, and is easier to be bent out-of-plane with respect to the plane, compared to the in-plane bending.

FIG. 4 shows one vibration absorbing element 13-$i$ ($i$=1, 2, 3 . . . n) out of the vibration absorbing elements 13-1 to 13-$n$. The vibration absorbing elements 13-$i$ includes first actuators 24-1 and 24-2 and second actuators 25-1 and 25-2. The first actuators 24-1 and 24-2 are disposed on a face of the first flange portion 22 which is opposed to the second flange portion 23. The first actuators 24-1 and 24-2 are arranged so that the web portion 21 is arranged between the first actuators 24-1 and 24-2. The second actuators 25-1 and 25-2 are disposed on a face of the second flange portion 23 which is opposed to the first flange portion 22. The second actuators 25-1 and 25-2 are arranged so that the web portion 21 is arranged between the second actuators 25-1 and 25-2.

Figure 5:
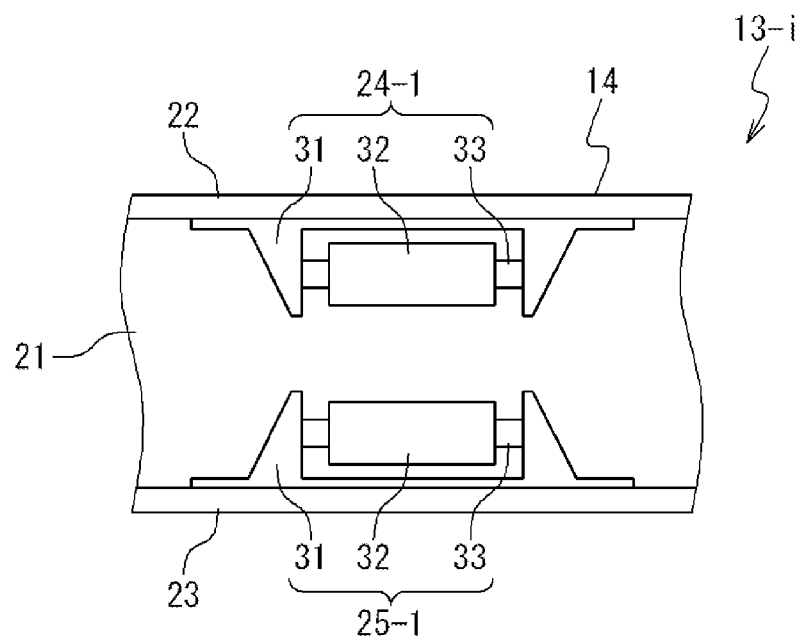
FIG. 5 is a diagram showing an elastically-beam-bending vibration absorbing element.

FIG. 5 shows the first actuator 24-1. The first actuator 24-1 includes a support member 31, a piezo actuator 32 and elastic bodies 33. The support member 31 is fixed to the first flange portion 22. The support member 31 includes two protrusions which protrude from a face of the first flange portion 22, the face being opposed to the second flange portion 23. The piezo actuator 32 includes a piezoelectric element and is disposed between the two protrusions of the support member 31. The elastic members 33 are disposed on both ends of the piezo actuator 32 so as to be sandwiched by the support member 31 and the piezo actuator 32. The elastic members 33 apply elastic forces to the piezo actuator 32 so as to compress the piezo actuator 32. In response to a predetermined electric signal (or voltage) applied by the piezo driver 18, the piezo actuator 32 of the first actuator 24-1 applies force so that the beam 14 is bent in-plane in the plane along which the web portion 21 is disposed, with the first flange portion 22 positioned outside.

The first actuator 24-2 is structured in the same way as the first actuator 24-1. In response to a predetermined electric signal (or voltage) applied by the piezo driver 18, the piezo actuator 32 of the first actuator 24-2 applies force so that the beam 14 is bent in-plane in the plane along which the web portion 21 is disposed, with the first flange portion 22 positioned outside.

The second actuator 25-1 includes a support member 31, a piezo actuator 32 and elastic members 33, similarly to the first actuator 24-1. The support member 31 is fixed to the first second flange portion 23. The support member 31 includes two protrusions which protrude from a face of the second flange portion 23, the face being opposed to the first flange portion 22. The piezo actuator 32 includes a piezoelectric element and is disposed between the two protrusions of the support member 31. The elastic members 33 are disposed on both ends of the piezo actuator 32 so as to be sandwiched by the support member 31 and the piezo actuator 32. The elastic members 33 apply elastic forces to the piezo actuator 32 so as to compress the piezo actuator 32. In response to a predetermined electric signal (or voltage) applied by the piezo driver 18, the piezo actuator 32 of the second actuator 25-1 applies force so that the beam 14 is bent in-plane in the plane along which the web portion 21 is disposed, with the second flange portion 23 positioned outside.

The second actuator 25-2 is structured in the same way as the second actuator 25-1. In response to a predetermined electric signal (or voltage) applied by the piezo driver 18, the piezo actuator 32 of the second actuator 25-2 applies force so that the beam 14 is bent in-plane in the plane along which the web portion 21 is disposed, with the second flange portion 23 positioned outside.

Figure 6:
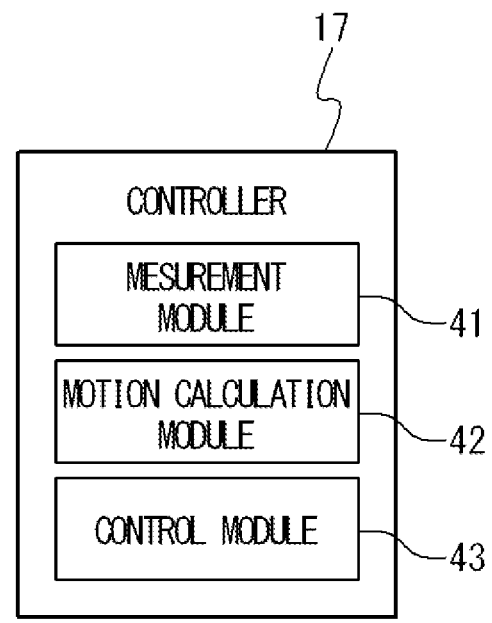
FIG. 6 is a block diagram showing a controller.

The computer program installed on the controller 17 includes a plurality of computer programs for allowing the controller 17 to provide a plurality of functions. As shown in FIG. 6, the plurality of functions includes a measured value collection module 41, a motion calculation module 42 and a control module 43.

The measured value collection module 41 collects measured values from the airframe acceleration sensors 11-1 to 11-3 and the main rotor rotational speed sensor 12. The measured values include a plurality of accelerations respectively measured by the airframe acceleration sensors 11-1 to 11-3 and the rotational velocity measured by the main rotor rotational speed sensor 12.

The motion calculation module 42 calculates a plurality of bending loads based on the measured values collected by the measured value collection module 41. The calculated bending loads are respectively associated with the vibration absorbing elements 13-1 and 13-2. The calculated bending loads indicate the forces to elastically bend the portions of the beam 14 where the vibration absorbing elements 13-1 and 13-2 are disposed, respectively. In other words, the bending load associated with the vibration absorbing elements 13-$i$ out of the plurality of bending loads indicates the force to bend the portion of the beam 14 where the vibration absorbing elements 13-$i$ is disposed. Furthermore, the bending loads are calculated so that the vibration transmitted via the beam 14 from the transmission 2 to the cabin 5 is cancelled (or reduced), that is, the vibration of the cabin 5 is reduced, when the vibration absorbing elements 13-1 and 13-2 apply the respective calculated bending loads to the beam 14.

The controller 43 controls the piezo driver 18 so that the vibration absorbing elements 13-1 and 13-2 respectively apply the bending loads calculated by the motion calculation module 43 to the beam 14.

Figure 7:
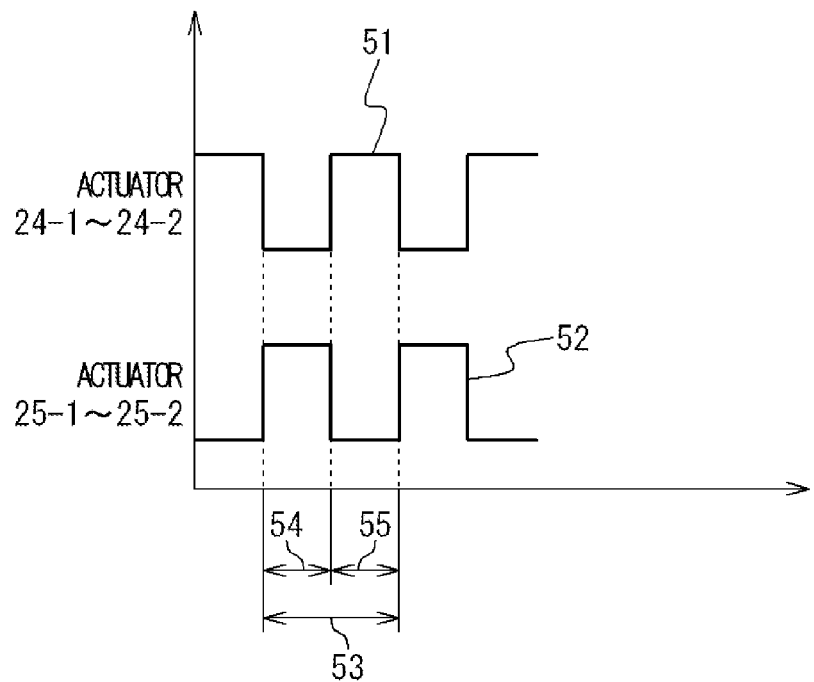
FIG. 7 is a graph showing an example of voltage levels of electric signals applied to first and second actuators by a piezo driver.

FIG. 7 shows the changes in the voltage levels of the electric signals applied by the piezo driver 18 to the piezo actuators 32 of the first actuators 24-1 and 24-2. The changes in the voltage levels denoted by the numeral 51 are periodic at a cycle 53; the voltage levels change at the cycle 53 in a substantially constant manner. The cycle 53 is identical to the cycle of the vibration transmitted via the beams 14 from the transmission 2 to the cabin 5, that is, the cycle of the vibration to be reduced. Each cycle 53 includes terms 54 and 55. The changes denoted by the numeral 51 indicate that the piezo driver 18 applies a predetermined voltage to the piezo actuators 32 of the first actuators 24-1 and 24-2 during the term 54 and that the piezo driver 18 does not apply any voltage to the piezo actuators 32 of the first actuators 24-1 and 24-2 during the term 55.

FIG. 7 further shows the changes in the voltage levels of the electric signals applied by the piezo driver 18 to the piezo actuators 32 of the second actuators 25-1 and 25-2. The changes in the voltage levels denoted by the numeral 52 are periodic at the cycle 53; the voltage level changes at the cycle 53 in a substantially constant manner. The changes denoted by the numeral 52 indicate that the piezo driver 18 does not apply any voltage to the piezo actuators 32 of the second actuators 25-1 and 25-2 during the term 54 and that the piezo driver 18 applies a predetermined voltage to the piezo actuators 32 of the second actuators 25-1 and 25-2 during the term 55.

Applying voltages in this manner allows the vibration absorbing elements 13-$i$ to apply the force to bend the beam 14 with a higher efficiency.

The above-described vibration reduction apparatus may be mounted when a helicopter according to the present invention is newly manufactured. An existing helicopter may be altered to a helicopter according to the present invention by mounting the above-described vibration reduction apparatus.

An embodiment of the vibration reduction method according to the present invention is implemented with the above-described vibration reduction apparatus. The controller 17 collects the measured values from the airframe acceleration sensors 11-1 to 11-3 and the main rotor rotational speed sensor 12. The measured values include a plurality of accelerations measured by the airframe acceleration sensors 11-1 to 11-3, respectively, and the rotational velocity measured by the main rotor rotational speed sensor 12.

The controller 17 calculates a plurality of bending loads based on the collected measured values. The calculated bending loads are respectively associated with the vibration absorbing elements 13-1 and 13-2. The bending loads are calculated so that the vibration transmitted via the beam 14 from the transmission 2 to the cabin 5 is reduced or the transmission of the vibration is blocked.

The controller 17 controls the piezo driver 18 so that the piezo driver 18 does not apply electric signals to the piezo actuators 32 of the vibration absorbing elements 13-1 and 13-2, when the turn-off of the control is selected by the input apparatus 16.

The controller 17 controls the piezo driver 18 based on the calculated bending loads when the turn-on of the control is selected by the input device 16. In this case, the piezo driver 18 supplies electric signals to the piezo actuators 32 of the vibration absorbing elements 13-1 and 13-2, respectively, under the control of the controller 17, so that the calculated bending loads are applied to the beams 14, respectively.

The piezo actuator 32 of each vibration absorbing elements 13-$i$ applies the calculated bending load to the beam 14 when the electric signal is applied thereto by the piezo driver 18. The application of the bending load to the beam 14 reduces the vibration transmitted from the transmission 2 to the cabin 5. Accordingly, the vibration reduction apparatus thus constructed can reduce the vibration transmitted from the transmission 2 to the cabin 5 via the beams 14 and reduce the vibration of the cabin 5.

The transmission 2 generates an N/rev vibration when the number of the main rotor blades 3 is N (where N is a natural number). Furthermore, the transmission 2 generates vibrations other than the N/rev vibration due to the effect of the wind received by the helicopter and soon. The vibration reduction apparatus according to the present invention can bend the beams 14 in-plane at various frequencies, and reduce the vibrations at various frequencies transmitted via the beams 14. This enables reducing vibrations at various frequencies transmitted to the cabin 5.

In other words, the vibration reduction apparatus thus constructed can reduce vibrations in a wider frequency range, compared to a passive-type dynamic vibration absorber including an elastic body and a weight. Furthermore, the vibration reduction apparatus thus constructed can be manufactured with a lighter weight, compared to such a passive-type dynamic vibration absorber. If the above-described vibration reduction apparatus is mounted on a helicopter in place of such a passive-type dynamic vibration absorber, the helicopter can be made lighter, compared to other helicopters provided with the passive-type dynamic vibration absorber.

Figure 8:
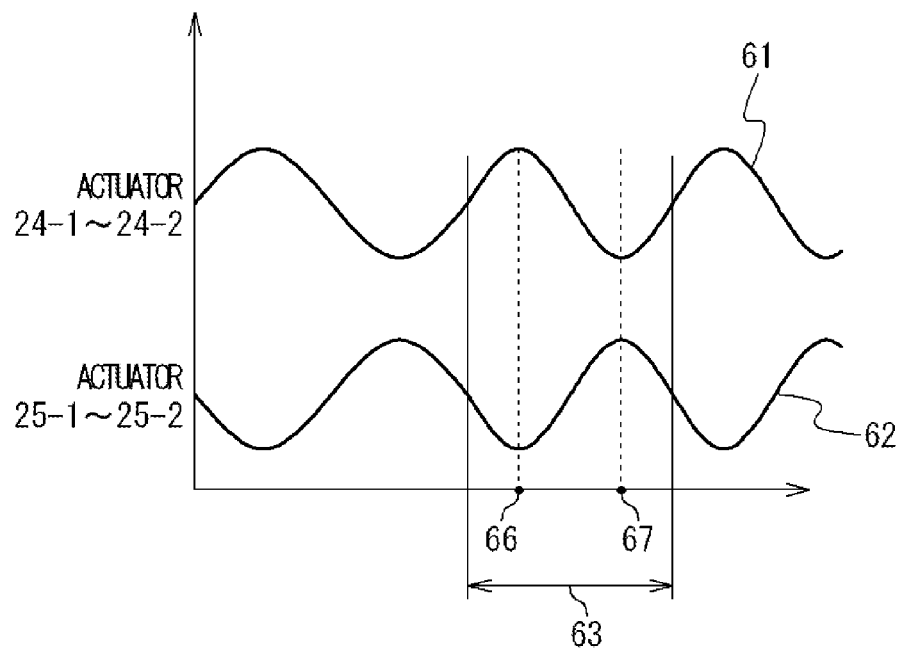
FIG. 8 is a graph showing another example of voltage levels of electric signals applied to first and second actuators by a piezo driver.

It should be noted that the piezo driver 18 may apply electric signals with a waveform other than the rectangular waveform to the piezo actuators 32. FIG. 8 shows another example of the changes in the voltage levels of the electric signals applied by the piezo driver 18 to the piezo actuators 32 of the first actuators 24-1 and 24-2. The changes in the voltage levels denoted by the numeral 61 are sinusoidal and the voltage levels periodically change at a cycle 63; the voltage levels change at the cycle 63 in a substantially constant manner. The cycle 63 is identical to the cycle of the vibration transmitted via the beams 14 from the transmission 2 to the cabin 5, that is, the cycle of the vibration to be reduced. Each cycle 63 includes a first time 67 and a second time 67. In the changes denoted by the numeral 61, the voltages applied to the piezo actuators 32 of the first actuators 24-1 and 24-2 by the piezo driver 18 are indicated as maximum at the first time 66, and the voltages applied to the piezo actuators 32 of the first actuators 24-1 and 24-2 by the piezo driver 18 are indicated as minimum at the second time 67.

FIG. 8 further shows the changes in the voltage levels of the electric signals applied by the piezo driver 18 to the piezo actuators 32 of the second actuators 25-1 and 25-2. The changes in the voltage levels denoted by the numeral 62 are periodic at the cycle 63; the voltage level changes at the cycle 63 in a substantially constant manner. In the changes denoted by the numeral 62, the voltages applied to the piezo actuators 32 of the second actuators 25-1 and 25-2 by the piezo driver 18 are indicated as minimum at the first time 66, and the voltages applied to the piezo actuators 32 of the second actuators 25-1 and 25-2 by the piezo driver 18 are indicated as maximum at the second time 67.

The application of the voltages with such a waveform other than rectangular waveform also enables the vibration absorbing elements 13-$i$ to apply to the beam 14 a force which bends the beam 14. Accordingly, the vibration reduction apparatus can reduce the vibration as is the case with the above-described embodiments, also when voltages of a waveform different from the rectangular waveform are applied to the piezo actuators 32.

It should be noted that the vibration reduction apparatus may control the first actuators 24-1, 24-2 and the second actuators 25-1 and 25-2 so that the beams 14 are expanded and contracted. In this case, the vibration reduction apparatus can cancel (or reduce) the compressive load and tensile load applied to the beams 14 caused by the vibration of the transmission 2. This results in that such a vibration reduction apparatus can reduce the vibration of a wider frequency range more certainly, compared to the vibration reduction apparatus of the above-described embodiments.

It should be noted that the piezo actuators 32 may be replaced with different actuators which cause motions of the beams 14. Examples of such actuators include an actuator incorporating a super magnetostrictor which is deformable by an applied magnetic field. A vibration reduction apparatus to which such actuators are applied can reduce the vibration more surely, as is the case with the vibration reduction apparatus in the above-described embodiments.

It should be noted that the first actuators 24-1, 24-2 and the second actuators 25-1 and 25-2 may be disposed at positions other than the positions between the first flange portion 22 and the second flange portion 23. For example, the first actuators 24-1 and 24-2 may be disposed on the face of the first flange portion 22 opposite to the face which is opposed the second flange portion 23, and the second actuators 25-1 and 25-2 may be disposed on the face of the second flange portion 23 opposite to the face which is opposed the first flange portion 22. The vibration reduction apparatus adopting such arrangement can reduce the vibration more certainly, as is the case with the vibration reduction apparatus in the above-described embodiments.

It should be also noted that the second actuators 25-1 and 25-2 may be removed from the vibration reduction apparatus, if sufficient loads can be applied to the beams 14 only with first actuators 24-1 and 24-2, in order to reduce the vibration of the cabin 5. In this case, although the loads can be applied to the beams 14 so that the beams 14 are bent in-plane in only one direction, such a vibration reduction apparatus can reduce vibrations in a wider frequency range more certainly, as is the case with the vibration reduction apparatus in the above-described embodiments.

It should be noted that a beam 14 may be replaced with a beam which is formed into cross section shapes other than the cross section shape of the I-section steel. Examples of such a beam include H-section steel and C-section steel. In this case, the first actuators 24-1, 24-2 and the second actuators 25-1 and 25-2 are disposed so that the beam is bent in-plane in a plane along which the beam is hard to be bent in-plane. The vibration reduction apparatus applied to such a beam can reduce the vibration more surely in the same manner as the vibration reduction apparatus of the above-described embodiments.

It should be also noted that the main rotor rotational speed sensor 12 may be removed, if the bending loads can be calculated only on the basis of the accelerations measured by the airframe acceleration sensors 11-1 to 11-3 so that vibrations transmitted to passengers are sufficiently reduced.

The helicopter may be equipped with only one vibration reduction apparatus if the vibration reduction apparatus can sufficiently reduce vibrations transmitted to passengers.

Such a vibration reduction apparatus may be used to reduce vibration of equipment other than a helicopter. Examples of such equipment include motor vehicles and washing machines.

The present application claims priority to Japanese Patent Application No. 2010-041767 filed on Feb. 26, 2010, the entire disclosure of which is incorporated herein by reference.

The invention claimed is:

1. A helicopter comprising:
an actuator applying a force to a vibration transmitting member fixed to a targeted object so as to bend said vibration transmitting member;
an acceleration sensor measuring an acceleration of said targeted object;
a rotational velocity sensor measuring a number of rotations per unit time of rotor blades rotatably supported by said vibration transmitting member, wherein said rotor blades generate thrust force of said helicopter by rotations thereof; and
a controller controlling said actuator based on said acceleration and said number of rotations per unit time,
wherein said actuator applies the force to said vibration transmitting member to additionally expand and contract said vibration transmitting member,
wherein said vibration transmitting member includes:
a web portion formed in a strip shape;
a first flange portion formed on one edge of said web portion; and
a second flange portion formed on another edge opposite to said one edge of said web portion, and
wherein said actuator applies the force to said vibration transmitting member so that said vibration transmitting member is bent in-plane along a plane along which said web portion is disposed.

2. The helicopter according to claim 1, wherein said actuator includes:
a first actuator which expands and contracts said first flange portion; and
a second actuator which expands and contracts said second flange portion.

3. The helicopter according to claim 2, wherein said actuator includes:
a piezoelectric element having both ends fixed to said vibration transmitting member; and
a piezo driver applying a voltage to said piezoelectric element, and
wherein said controller controls said piezo driver so that the force is applied to said vibration transmitting member.

4. A vibration reduction method comprising:
measuring an acceleration of a targeted object;
measuring a number of rotations per unit time of rotor blades rotatable supported by a vibration transmitting member fixed to said targeted object, wherein said rotor blades generate thrust force of a helicopter by rotations thereof; and
controlling an actuator applying a force to said vibration transmitting member based on said acceleration and said number of rotations per unit time so that said vibration transmitting member is bent,
wherein said actuator applies the force to said vibration transmitting member so that said vibration transmitting member is additionally expanded and contracted,
wherein said vibration transmitting member includes:
a web portion formed in a strip shape;
a first flange portion formed on one edge of said web portion; and
a second flange portion formed on another edge opposite to said one edge of said web portion, and
wherein said actuator applies the force to said vibration transmitting member so that said vibration transmitting member is bent in-plane along a plane along which said web portion is disposed.

5. The vibration reduction method according to claim 4, wherein said actuator includes:
a first actuator which expands and contracts said first flange portion; and
a second actuator which expands and contracts said second flange portion.

6. The vibration reduction method according to claim 5, wherein said actuator includes:
a piezoelectric element having both ends fixed to said vibration transmitting member; and
a piezo driver applying a voltage to said piezoelectric element, and
wherein said vibration reduction method further comprises controlling said piezo driver so that the force is applied to said vibration transmitting member.

* * * * *